United States Patent
Alden et al.

(10) Patent No.: US 6,762,726 B2
(45) Date of Patent: Jul. 13, 2004

(54) ANTENNA ARRAY FOR THE MEASUREMENT OF COMPLEX ELECTROMAGNETIC FIELDS

(75) Inventors: Adrian Alden, Ottawa (CA); Peter Bouliane, Ottawa (CA); Ming Zhang, Ottawa (CA)

(73) Assignee: Her Majesty the Queen in right of Canada as represented by the Minister of Industry, Ottawa (CA)

( * ) Notice: Subject to any disclaimer, the term of this patent is extended or adjusted under 35 U.S.C. 154(b) by 0 days.

(21) Appl. No.: 10/345,931

(22) Filed: Jan. 17, 2003

(65) Prior Publication Data

US 2003/0231141 A1 Dec. 18, 2003

Related U.S. Application Data

(60) Provisional application No. 60/349,264, filed on Jan. 18, 2002, and provisional application No. 60/404,417, filed on Aug. 20, 2002.

(51) Int. Cl.[7] .................................................. H01Q 3/00
(52) U.S. Cl. ....................................... 343/703; 343/893
(58) Field of Search .............................. 343/703, 701, 343/893, 909, 700 MS

(56) References Cited

U.S. PATENT DOCUMENTS

| | | | |
|---|---|---|---|
| 5,394,157 A | * | 2/1995 | Garneski ..................... 343/703 |
| 5,585,808 A | | 12/1996 | Wysome ..................... 343/703 |
| 5,982,326 A | * | 11/1999 | Chow et al. ......... 343/700 MS |
| 6,188,365 B1 | | 2/2001 | Mattsson et al. ........... 343/703 |
| 6,492,957 B2 | | 12/2002 | Carillo, Jr. et al. ......... 343/841 |
| 2003/0043086 A1 | * | 3/2003 | Schaffner et al. ........... 343/909 |

FOREIGN PATENT DOCUMENTS

| | | |
|---|---|---|
| EP | 0 772 053 A2 | 5/1997 |
| WO | WO 01/75460 A1 | 10/2001 |

OTHER PUBLICATIONS

Collingnon et al., "Quick Microwave Field Mapping for Large Antennas", Microwave Journal, Dec. 1982, pp. 129–130.
Previti, "EMSCAN: A Tool to Measure EMI Emissions from Printed Circuit Packs", EMC Testing, Nov. 1989, pp. 4–5.

* cited by examiner

*Primary Examiner*—Wilson Lee
(74) *Attorney, Agent, or Firm*—Freedman & Associates

(57) ABSTRACT

A method and apparatus for measuring an electromagnetic field are disclosed. In accordance with the apparatus an array of substantially identical antenna elements having a substantially shorter length than a wavelength of the electromagnetic field and being equi-spaced are provided. The spacing is larger than approximately three times the length of the antenna elements. Each antenna element is for sensing the electromagnetic field at a predetermined location and for providing a signal in dependence upon the sensed field. By providing antenna elements meeting the criteria set out herein accurate electromagnetic field strengths are measurable absent significant mutual coupling and scattering effects between the antenna elements.

35 Claims, 14 Drawing Sheets

ANTENNA ARRAY FOR THE MEASUREMENT OF COMPLEX ELECTROMAGNETIC FIELDS

This application claims benefit from U.S. Provisional Application No. 60/349,264 filed Jan. 18, 2002 and U.S. Provisional Application No. 60/404,417 filed Aug. 20, 2002.

FIELD OF THE INVENTION

The present invention relates to antennas for measuring electromagnetic wave field quantities and in particular to antenna arrays having an arrangement of antenna elements with specific dimensions, spacing and impedance for improved performance.

BACKGROUND OF THE INVENTION

In recent years there has been a widespread proliferation of wireless communication systems such as cellular telephones or short range microwave communication links replacing computer network cables in so-called Bluetooth systems. However, with this proliferation there is much concern throughout the world that radiation from electromagnetic fields causes human body tissue damage. The antenna and the body of wireless electronic equipment such as cellular telephones come into close contact with a person's head or other sensitive body tissue, thereby creating a close exposure to an electromagnetic field. Therefore, there is a growing demand to maximize performance of the wireless communication systems while simultaneously minimizing exposure of the human body to electromagnetic fields.

In order to meet this demand it is necessary to measure the electromagnetic field components in the near —field of radiating sources. Examples of such measurements are the characterization of near-field distributions of antennas and oscillators, evaluation of electromagnetic interference emissions, measurement of near-field quantities in bioelectromagnetic phantoms, measurement of scattered fields from microwave medical imaging, etc.

A major difficulty is the measurement of complex electromagnetic field distributions over larger areas or in larger volumes typically having dimensions between 1 and 100 wavelengths, to be measured with sampling intervals being a portion of a wavelength. For such measurements, single antenna mechanical scanning of a volume under test, disclosed for example in U.S. Pat. No. 5,585,808 issued to Wysome in Dec. 17, 1996, U.S. Pat. No. 6,188,365 issued to Mattsson et al. in Feb. 13, 2001, or in PCT Application WO 01/75460 A1 published Oct. 11, 2001, requires many hours of testing to be repeated upon modification of any test condition, which are incorporated herein by reference. In addition, the use of a moving single probe for measuring the electromagnetic field distribution within a volume is inherently crude.

Use of preferably, multi-dimensional fixed antenna arrays provides a substantial reduction of measurement time while providing the potential for an increased accuracy of the measurements. An electromagnetic wave incident on a dipole element of the antenna array induces a current in the dipole elements. The induced current causes re-radiation generating a scattered field which then induces a current in other dipoles of the antenna array.

However, measurements using fixed antenna arrays suffer from three problems not present in single antenna systems. The dipole elements forming the antenna array are typically made of highly conducting materials, causing reflection and refraction of an incident electromagnetic wave at the boundaries of the array. From the finiteness of the array, edge effects typically occur and are undesirable. The reflections interact with other elements, in particular, a near-field radiating source. The refractions lead to errors in the field measurements. An electromagnetic wave incident on a dipole element of the antenna array induces a current in the dipole elements. The induced current causes re-radiation generating a scattered field which then induces a current in other dipoles of the antenna array.

Two-dimensional antenna arrays of terminated small dipoles and loops have been developed to reduce the problem of measurement time as disclosed in Collingnon, G., et al. "Quick Microwave Field Mapping for Large Antennas", Microwave Journal, December 1982, pp. 129–130, and Previti, J. S., "A Tool to Measure EMT Emissions from Printed Circuit Packs", EMC Testing, November 1989, pp. 4–5, references to which are incorporated herein by reference. However, no design criteria for antenna dimensions, spacing, and loading have been described and complex numerical calculations are required for each array configuration in order to ensure that each element of the array meets the conditions of low scattering, mutual coupling and edge diffraction.

SUMMARY OF THE INVENTION

It is, therefore, an object of the invention to provide a fixed antenna array for measuring of electromagnetic fields.

In accordance with the invention, there is provided an antenna array for measuring an electromagnetic field comprising: a plurality of substantially identical antenna elements having a substantially shorter length than a wavelength of the electromagnetic field and being placed at a substantially same spacing between consecutive antenna elements, the spacing being larger than approximately three times the length of the antenna elements, each antenna element for sensing the electromagnetic field at a predetermined location and for providing a signal in dependence thereupon, the signal being indicative of an approximately accurate electromagnetic field strength substantially absent mutual coupling effects between the antenna elements.

In accordance with the invention, there is provided an antenna array for measuring an electromagnetic field comprising: a plurality of substantially identical antenna elements having a substantially shorter length than a wavelength of the electromagnetic field and being placed at a substantially same spacing between consecutive antenna elements, the spacing being larger than approximately three times the length of the antenna elements, each antenna element for sensing the electromagnetic field at a predetermined location and for providing a signs in dependence thereupon, the signal being indicative of an approximately accurate electromagnetic field strength substantially absent scattering effects between the antenna elements.

In accordance with the invention, there is further provided an antenna for measuring an electromagnetic field comprising: an array of antenna elements for sensing the electromagnetic field at a predetermined location and for providing a signal in dependence thereupon; an electromagnetically separating layer for substantially shielding the electromagnetic field sensed by the at least an antenna element from electromagnetic radiation emitted from circuitry transmitting the signal; and, an absorber disposed between the electromagnetically separating layer and a source of the electromagnetic field for attenuating electromagnetic radiation.

In accordance with another aspect of the invention, there is provided a method for measuring strength of an electromagnetic field emitted from a source comprising the steps of: disposing at a predetermined location a plurality of substantially identical antenna elements having a length being substantially shorter than a wavelength of the electromagnetic field and having a substantially same spacing between consecutive antenna elements, the spacing being larger than approximately three times the length of the antenna elements; measuring a field strength of the electromagnetic field at each antenna element and providing a signal in dependence thereupon, the signal being indicative of an approximately accurate electromagnetic field strength substantially absent mutual coupling effects between the antenna elements; and, determining the approximately accurate electromagnetic field strength at each predetermined location absent a step of signal post processing for correcting the mutual coupling effects between the antenna elements.

In accordance with the other aspect of the invention, there is also provided a method for measuring strength of an electromagnetic field emitted from a source comprising the steps of: disposing at a predetermined location at least an array of antenna elements for sensing the strength of the electromagnetic field and for providing a signal in dependence thereupon; disposing an electromagnetically separating layer for substantially shielding the electromagnetic field sensed by the at least an antenna element from electromagnetic radiation emitted from circuitry transmitting the signal; disposing an absorber between the electromagnetically separating layer and a source of the electromagnetic field; and, measuring the strength of the electromagnetic field at the at least an antenna element and providing a signal in dependence thereupon, the signal being indicative of an approximately accurate electromagnetic field strength absent a step of signal post processing for correcting distortions of the measured field strength due to electromagnetic radiation emitted from the circuitry transmitting the signal.

BRIEF DESCRIPTION OF THE FIGURES

Exemplary embodiments of the invention will now be described in conjunction with the following drawings, in which.

DETAILED DESCRIPTION OF THE EMBODIMENT OF THE INVENTION

Hereinbelow, an antenna array for measuring complex electromagnetic fields according to the invention is described with dipole elements placed in an array for sensing electric field quantities. However, it is evident to those of skill in the art to use other sensing elements in the antenna array such as loops for measuring magnetic field quantities. Furthermore, while for generality the antenna array will be described as a 3-D dipole antenna array it will become apparent to those skilled in the art to construct linear and planar antenna array versions based on the present disclosure. Further, curved surfaces such as cylindrical arrays and spherical arrays are also possible.

Figure 1:
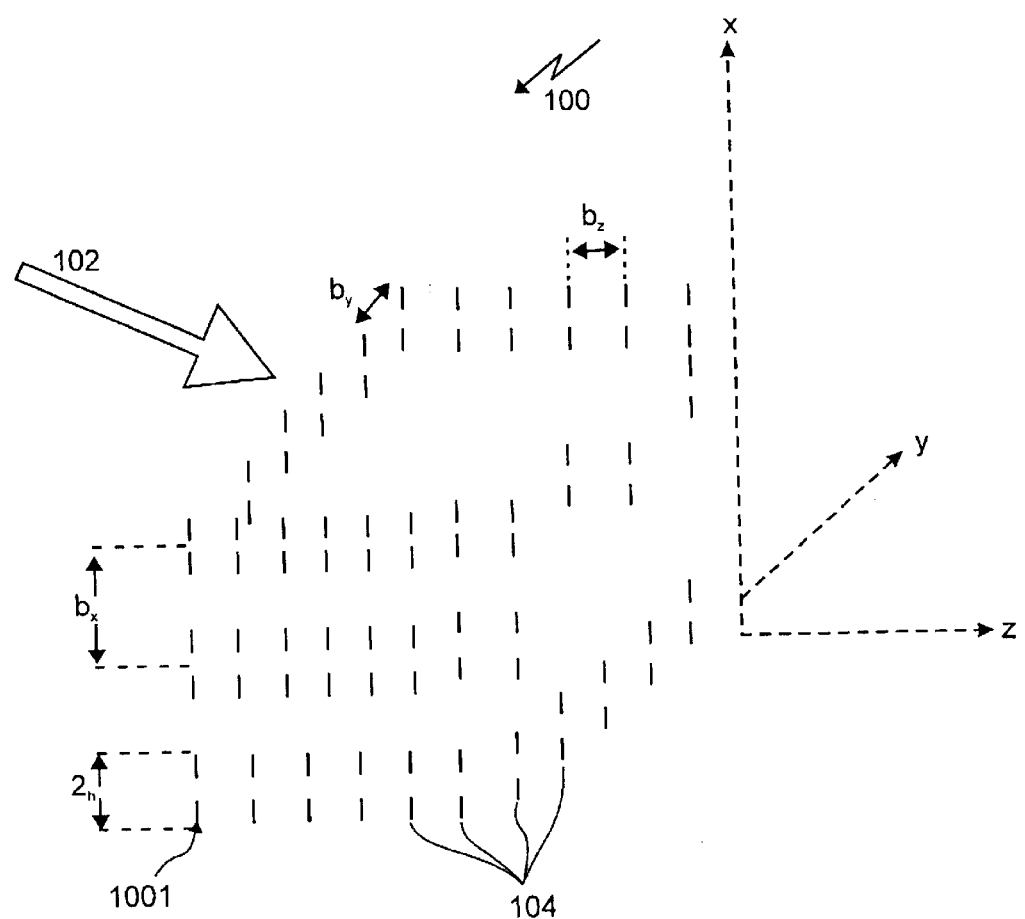
FIG. 1 is a simplified diagram illustrating the geometry of an antenna array according to the invention.

FIG. 1 illustrates schematically a 3-D dipole antenna array 100 according to the invention. The antenna array 100, as shown in FIG. 1, is positioned to intercept the x-component of the electric field of a plane electromagnetic wave 102 incident thereupon. Dipole elements 104 are substantially identical cylindrical structures of length $2h$ and diameter $2a$. The dipole elements 104 are substantially symmetrically arranged in an orthogonal pattern throughout the antenna array 100 having spacing between the dipole elements 104 of $b_x$, $b_y$, $b_z$ in x, y, z direction, respectively.

Figure 2:
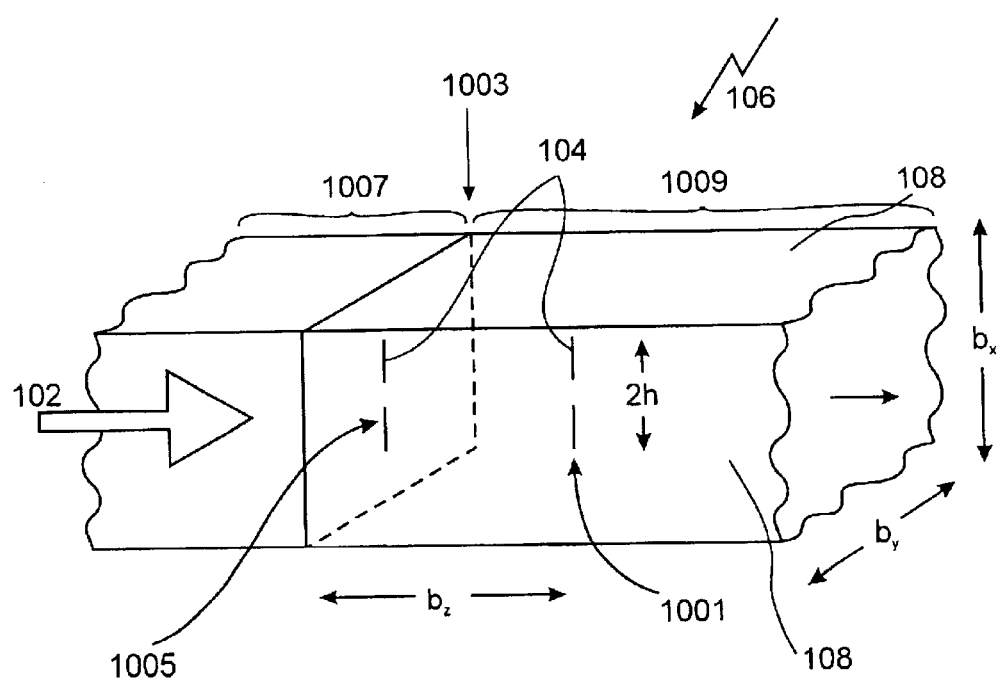
FIG. 2 is a diagram illustrating a unit cell equivalent for wave propagation.

In the case of an array antenna having a large number of substantially identical and symmetrically placed dipole elements, it is possible to reduce the analysis of the wave propagation within the 3-D array to the analysis of a unit cell as shown in Oliner, A. A. and Malech, R. G., "Mutual Coupling in Infinite Scanning Antennas", Vol.11, Academic Press, New York, 1966. The unit cell 106 extends through the volume of the antenna array 100, for example, in z direction, and contains a 1-D array of dipole elements 104, as shown in FIG. 2. The unit cell 106 is considered a hypothetical waveguide with "phase walls." Walls 108 of the unit cell 106 image each dipole element 104 inside the unit cell 106 into an infinite planar array reconstituting the 3-D lattice of dipole elements of the antenna array 100. Mutual coupling between dipole elements of the infinite planar array is accommodated by the presence of the unit cell walls 108.

The Unit cell of FIG. 2 includes a first X dipole element 1005 and a second dipole element 1001 having a diameter $2a$. The array volume 1009 is a space occupied by the array of unit cells. The plane electromagnetic wave 102 propagates through free medium 1007 prior to reaching an interface 1003 and then passing across the interface 1003 and propagating within the array volume 1009.

Furthermore, it is possible to consider the complex electromagnetic field to be measured, at any point inside and outside the antenna array volume being equivalent to a superposition of a number of plane waves passing through that point. Each waveguide mode within the unit cell 106 models one specific plane wave inside and outside the antenna array volume and is described by a characteristic impedance $z_0(\lambda, \phi)$ and wavelength $\lambda_0(\lambda, \phi)$ with both being functions of the direction of propagation (λ,φ) of the plane wave constituting that mode.

For an infinite 3-D array, it is possible instead of considering unit cell wave propagation in the z direction, to assume the same wave to propagate in the x direction. From an analysis of cut-off wavelengths for a general 3-D medium, Brown, J., "Artificial Dielectrics Having Refractive Indices Less Than Unity", Proceedings IEE, Monograph No. 62R, Vol. 100, Pt. 4, pp. 51–62, May 1953 has shown that the two approaches are identical if equal spacing of the dipoles in x, y, z direction is chosen, i.e.

$$b_x = b_y = b_z = b. \quad (1)$$

For this condition, no longitudinal reactive interaction between elements along the unit cell 106 occurs and a model describing a single dipole in a unit cell is then valid for each dipole element 104 in the unit cell 106 of interest. Optionally, it is possible to use unequal spacing in this model, provided the spacing between the dipoles 104 in longitudinal direction of the unit cell 106 is not smaller than the spacing perpendicular to the unit cell 106. In this case the modeled dipoles remain decoupled.

Figure 3:
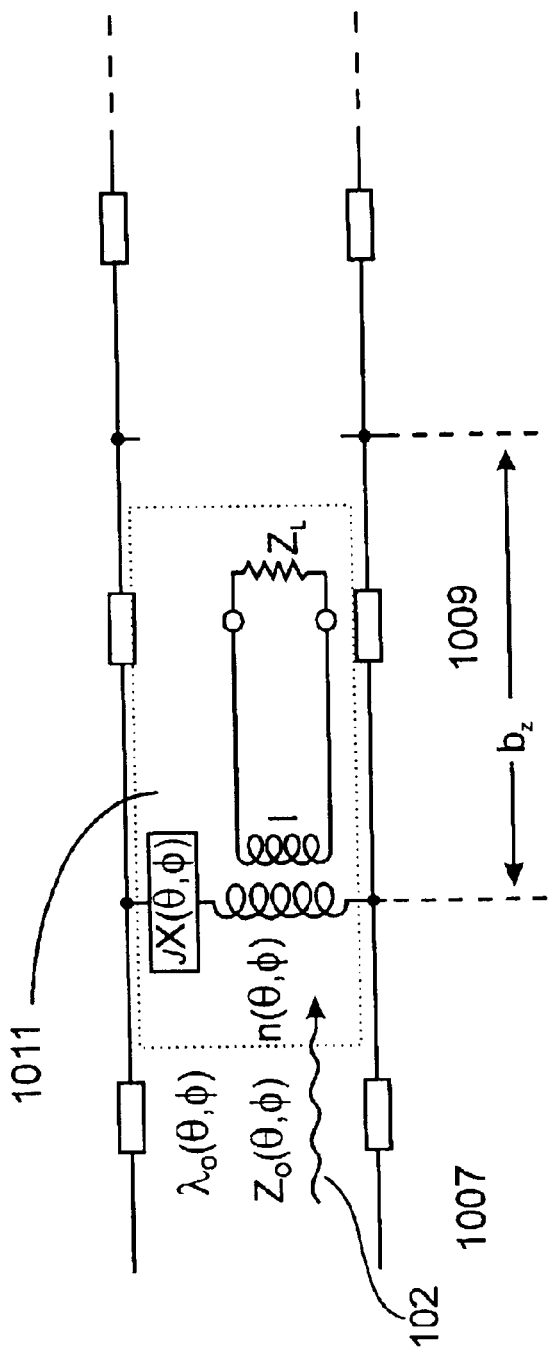
FIG. 3 is a diagram illustrating an equivalent circuit for a dipole element within the shown in FIG. 2.

Assuming the length of the dipole elements 104 being considerably larger than the diameter, i.e.

$$2h \geq 10(2a), \quad (2)$$

each dipole element is modeled based on an equivalent circuit 1011 as illustrated in FIG. 3. The dipole element 104 is described as a transformer having a transformer ratio $1:n(\theta,\phi)$ for modeling the coupling of the current at the dipole terminals to the effective shunt current across the unit cell 106 due to the dipole element 106, and having a reactance $jX(\theta,\phi)$ for representing the stored electromagnetic energy in the vicinity of the dipole element 104. In general, the transformer ratio $1:n(\theta, \phi)$ and the reactance $jX(\theta, \phi)$ are functions of the propagation direction $(\theta,\phi)$. The load impedance $Z_L$ models external devices terminating each element for permitting readout of each sample of the measured electric field.

Assuming the wavelength of the electromagnetic field to be measured being substantially longer than the length of the dipole elements 104, i.e.

$$\lambda_0 \geq 10(2h), \quad (3)$$

quasi-static field conditions are obtained and the reactive field, which is localized around the dipole element, is limited to a volume surrounding the dipole element within one dipole length. Therefore, the spacing h between dipole elements is chosen to be greater than three times the dipole length, i.e.

$$b \geq 6h, \quad (4)$$

placing the walls of the unit cell beyond the—distorted— reactive field. The dipole reactance is a representation of the stored energy in the neighborhood of the dipole element. For distant walls, the reactance is almost independent of the nature of the walls of the unit cell, i.e. the direction of propagation of the plane wave.

From the equivalent circuit shown in FIG. 3 follows that the reactance $jX(\theta,\phi)$ is equal to that of an unloaded dipole element within the cell. An approximate analytical expression is thus obtained by considering a small cylindrical obstacle within the unit cell and placed distantly from the cell walls. The polarizability of such a dipole element is then independent from the nature of the cell walls, allowing use of small obstacle theory for determining the reactance of a small obstacle in a unit cell or other transmission line by $1/jX = j\omega\epsilon P_0 \cdot e_0$, where P is the polarizability of an unloaded cylindrical obstacle having the dimensions of a dipole element, and $e_0$ is the electric field mode function for the plane wave in question. For the reactance $jX(\theta,\epsilon)$ shown in FIG. 3 being approximately independent of the direction of the plane wave the following expression for the reactance is obtained $$1/jX = \frac{4h^3 j\omega\varepsilon}{(3\ln(2h/a) - 1)b^2} \quad (5)$$

In Oliner, A. A. and Malech, R. G., "Mutual Coupling in Infinite Scanning Antennas", Vol. II, Academic Press, New York, 1966, an expression for the transformer ratio 1:n as a function of the direction of propagation of the incident plane wave is given. This transformer ratio is exactly constant with respect to the direction of propagation for an array of infinitesimal dipole elements. From the above-cited expression the dependence of the transformer ratio on the direction of propagation of the incident plane wave has been determined for small but finite sized elements showing that the transformer ratio is nearly constant. For example, for an array of dipole elements having a length of $\lambda/20$ spaced at three times their length the transformer ratio varies less than 0.2% with the direction of propagation.

Using the stationary formula taught by Harrington, R. F., "Time-Harmonic Electromagnetic Fields", McGraw-Hill, New York, 1961, the transformer ratio is found from a surface integral over a cell transverse plane normalized to the dipole terminal current $I_{in}$ as $n = 1/I_{in} \int\int J_s \cdot e_0 ds$. The current distribution $J_S$ is well approximated by a product of sinusoidal and "delta" functions corresponding to currents oriented along and across the dipole element, respectively. The current distribution along the dipole element is independent of the characteristics of the cell walls for the dimensions disclosed above with respect to equations (1) to (4). The electric field mode function $e_0$ is a function of the transverse coordinates and the direction of propagation of the incident plane wave. The transformer ratio 1:n is thus given by the integral of the product of the sinusoidal current distribution and the electric field mode function component along the dipole element normalized to the dipole terminal current. For a long dipole, this integral varies with the direction of propagation of the incident plane wave, but as the ends of the dipole element approach the terminals, mode function variations become less significant and, the integral becomes constant with respect to the direction of propagation, as shown in Knittel, G., et al., "Element Pattern Nulls in Phased Arrays and their Relation to Guided Waves", Proc. IEEE, Vol. 56, 11, pp. 1822–1836, November 1968, and in Brown, J., "Artificial Dielectrics Having Refractive Indices Less Than Unity", Proc. IEE, Vol. !02B, pp. 51–62, May 1953. Therefore, for a small dipole element the transformer ration is independent of the direction of propagation of the incident plane wave and given by $$n = \frac{2(2h)}{\pi b}. \quad (6)$$

Figure 4A:
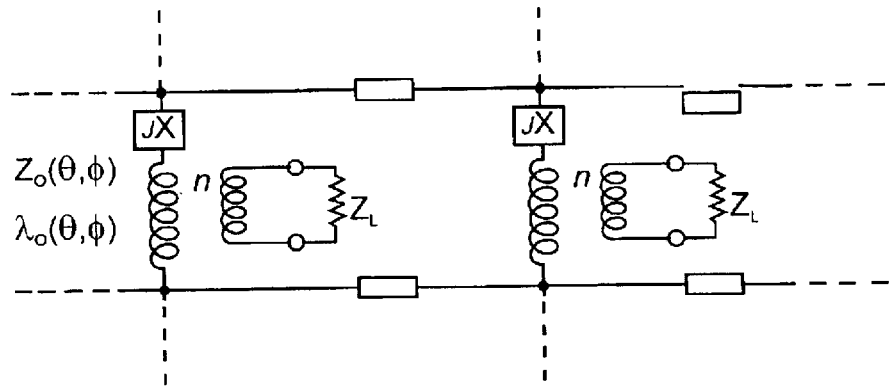
FIGS. 4a to 4c are diagrams illustrating reduced equivalent circuits for the dipole shown in FIG. 3.
Figure 4B:
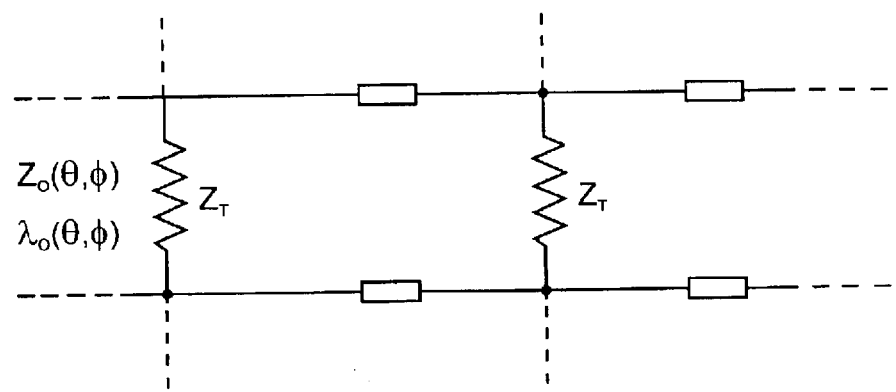

The net electric field in the direction of a dipole element is given by the sum of the electric field components of each mode at that point. With both parameters of the dipole model being independent of direction of propagation $\theta\epsilon$, based on the criteria of small dipoles and large spacing, the RF voltage at the terminals of a dipole element is then free of mutual coupling effects, as shown in the equivalent circuit of FIG. 4a and, therefore, a true measure of the net electric field at that location. The equivalent shunt impedance $Z_T$ across the unit cell at each dipole location becomes $$Z_T = jX + \frac{Z_L}{n^2}, \quad (7)$$

as shown in FIG. 4b. When the shunt impedance $Z_T$ is large compared to the characteristic impedance $Z_0$ of the unit cell, it is possible to introduce a large number of antenna array planes in the path of the incident wave before significant scattering of the wave results.

For finite antenna array volumes the behavior of each dipole element 104 is different and the analysis of a large number of dipole elements 104 becomes extremely difficult. Based on a negligible mutual coupling for an infinite antenna array as provided by the above criteria, approximately no coupling occurs between edge elements and elements neighbor thereto—present or missing. Further, scattering from an edge element is dependent almost only on the reactance and load termination of that element.

Figure 5A:
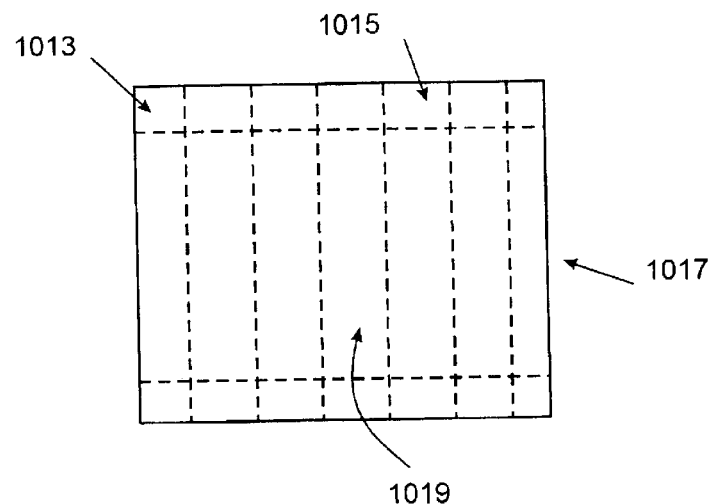
FIGS. 5a to 5c are diagrams illustrating the division of an array plane into regions and according unit cells.
Figure 5B:
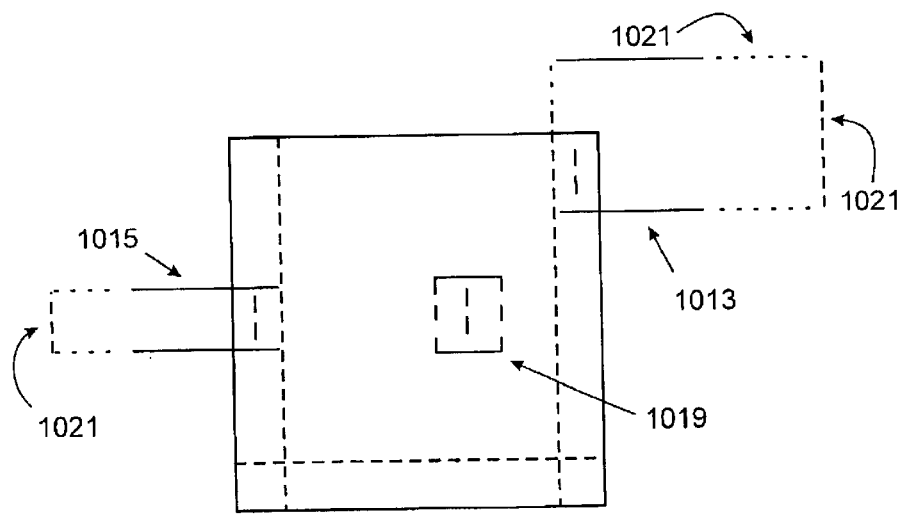
Figure 5C:
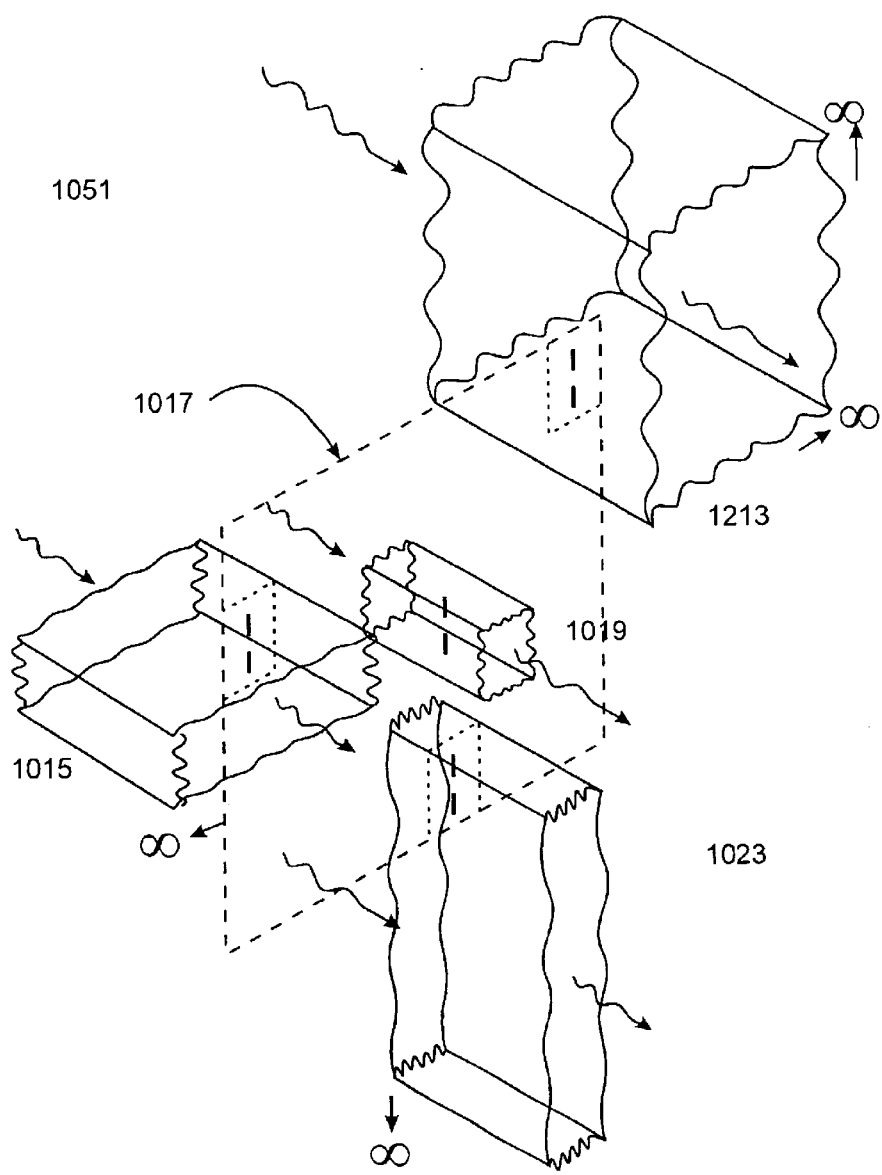

In a first step each plane of the antenna array volume is divided into central 1019, edge 1015, and corner 1013 regions, as shown in FIG. 5a. The central region 1019 with each dipole element being surrounded by at least a nearest identical neighbor element is assumed as a doubly-infinite antenna array plane for analysis (see above). For an edge 1015 or corner 1013 dipole element, behavior is assumed to be determined by the absence or presence of nearest neighbor elements only. Therefore, the analysis of the array plane shown in FIG. 5a is reduced to the analysis of 3 types of unit cells operating in parallel, as shown in FIGS. 5b and 5c. The unit cells located in the edge 1015 and corner 1013 regions are assumed to have one or two walls at infinity 1021, respectively, in order to prevent imaging into the doubly-infinite central region. For example, the walls of the corner cell 1013 shown in FIG. 5b reflect a corner dipole into itself surrounded by its two closest neighbors. Thus edge 1015 and corner 1013 dipole elements are represented by semi-infinite unit cell concepts in a similar fashion to the central 1019 dipole elements. The characteristic of an edge 1015 or corner 1013 dipole element is then analogous to a single dipole element asymmetrically placed within a unit cell to which an equivalent circuit similar to that shown in FIG. 3 is applicable. Mutual coupling is prevented by the dimensional criteria given above. Some example cells such as the bottom edge cell 1023, the corner cell 1213, the side edge cell 1015 are shown relative to incident wave 1051 and array plane 1017 in FIG. 5c.

Figure 4C:
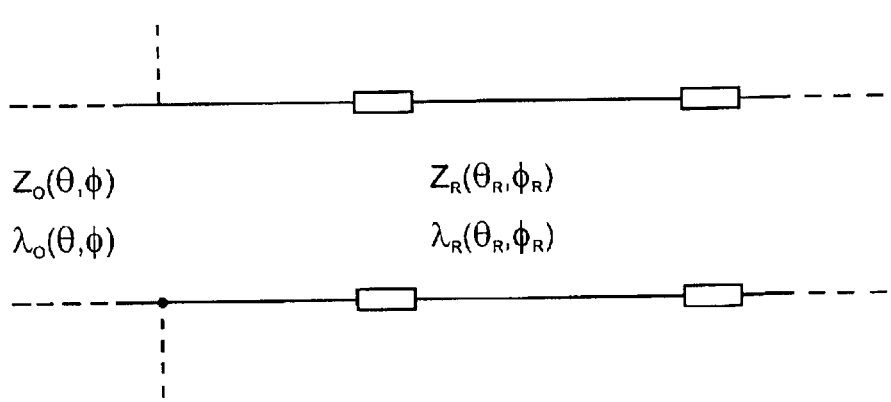

Due to the semi-infinite size of these unit cells, an incident plane wave is scattered by the edge 1015 and corner 1013 dipole elements into an infinite number of propagation modes. This corresponds to a diffraction of each plane wave by the edge 1015 and corner 1013 dipole elements with waves from each type of unit cell reflected and refracted throughout the antenna array volume in a complex manner. Using the same approach as disclosed heretofore for the central elements, scattering into these other modes is prevented by limiting the flow of dipole current by using large dipole impedances $Z_T$—equation (7). The unit cell periodically shunted by the impedance $Z_T$, as shown in FIG. 4b, has an performance identical to a transmission line of equivalent characteristic impedance $Z_R$ and propagation constant $\gamma_R$, as shown in the equivalent circuit of FIG. 4c with $$\cosh\gamma_R = \cosh\gamma_0 + \frac{Z_0}{2Z_T}\sinh\gamma_0 \quad (8)$$

and $$Z_R = Z_0 \frac{\tanh\gamma_0/2}{\tanh\gamma_R/2}. \quad (9)$$

As the shunt impedance $Z_T$ gets large compared to $Z_0$, the second term in equation (8) becomes small and the wave propagates with a propagation constant near that of the free-medium 1007, with only small scattering. The above equations (8) and (9) describe the performance for a dipole-directed field component. For an array of single-polarization dipole elements, the propagation constant for field components in orthogonal directions is that of the free-medium since the effect—or polarizability—of the dipole elements is negligible in these directions.

The ratio $Z_R/Z_0$ provides a direct measure of the reflection of a wave incident on the antenna array, and the propagation constant $N\gamma_R$ describes the attenuation and phase shift of the incident wave passing through N planes of the antenna array. For example, for a change in phase shift from free-medium values of less than 30 degrees, an attenuation of less than 10%, and a reflected power of at least 20 dB below the incident wave power $$\pi/6 \geq Im(N\gamma_R - N\gamma_0) \geq -\pi/6 \quad (10)$$

$$\ln 1.1 \geq Re(N\gamma_R - N\gamma_0) \geq \ln 0.9 \quad (11)$$

$$20\log_{10}\left|\frac{Z_R/Z_0 - 1}{Z_R/Z_0 + 1}\right| \leq -20 \quad (12)$$

Equations (1) to (12) describe an antenna array system design according to the invention. For example, for dipole elements of length 1.5 cm, diameter of 0.4 mm and spacing of 4.5 cm in free space, the transformer ratio n is 0.2 and the capacitive reactance jX is 100 $Z_0$ at a frequency of 900 MHz. Using direct detection at each dipole element the dipole load impedance for a typical beam-lead diode at this frequency is 6$Z_0$. A shunt impedance of 250$Z_0$ thus appears across the transmission line, equation (7). Using the phase shift criterion of equation (10), a maximum of 200 antenna array planes for the antenna array volume at 900 MHz with a reflection from the antenna array face of 55dB below the incident wave are employable.

Hereinbelow, the design of a planar antenna array for scanning the microwave near-field of equipment under test (EUT) such as a cellular telephone according to the invention is described. The planar antenna array or scanner is considered to be a lossy antenna receiving a number of plane waves propagating in different directions. These waves as an ensemble—plane wave spectrum or PWS—constitute the complex radiation from the EUT. The scanner transforms the PWS just outside its front surface to the voltages measured at its multiple outputs. The voltage at each output port—load—is then a linear combination of the voltages generated by the plane waves propagating in the different directions. If the number of output ports equals the number of discrete wave directions needed to specify the radiation, the PWS is determined by solving a set of simultaneous equations. From the PWS it is possible to determine the radiated power and field distributions in any plane in front of the EUT.

Figure 6:
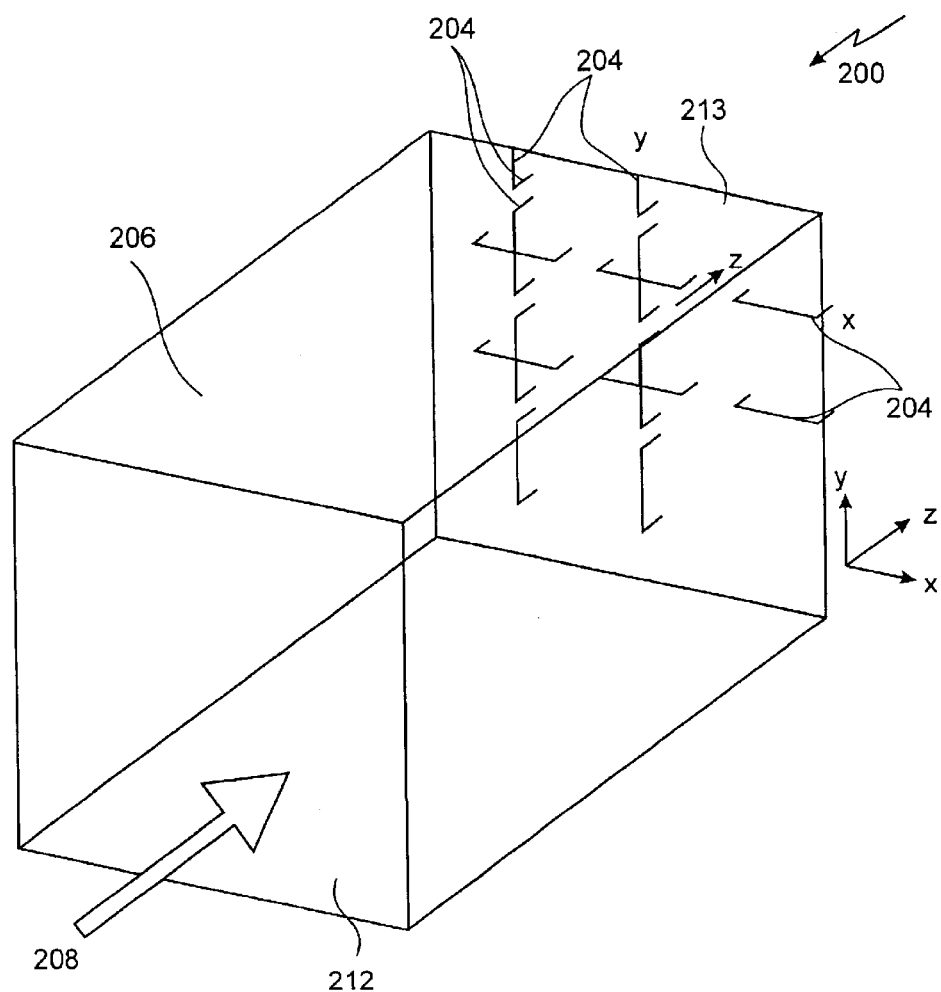
FIG. 6 is a simplified diagram illustrating an antenna array according to the invention.
Figure 7:
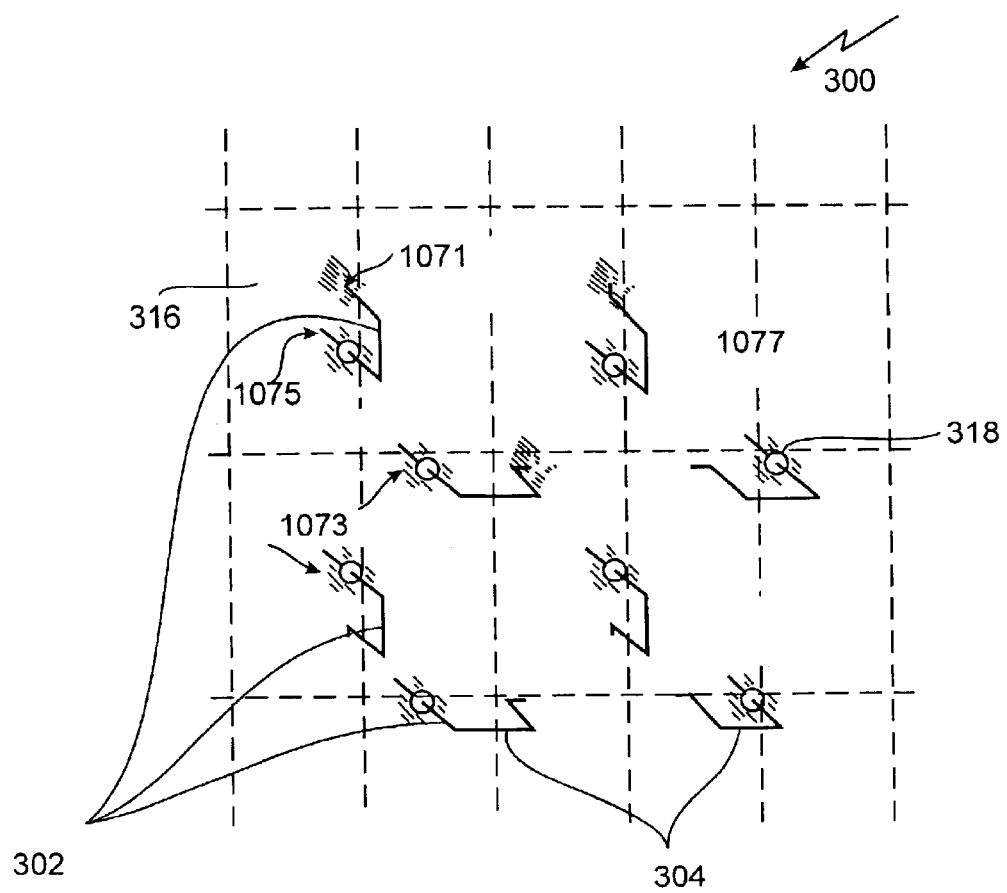
FIG. 7 is a simplified diagram illustrating an embodiment of an antenna array according to the invention.
Figure 8:
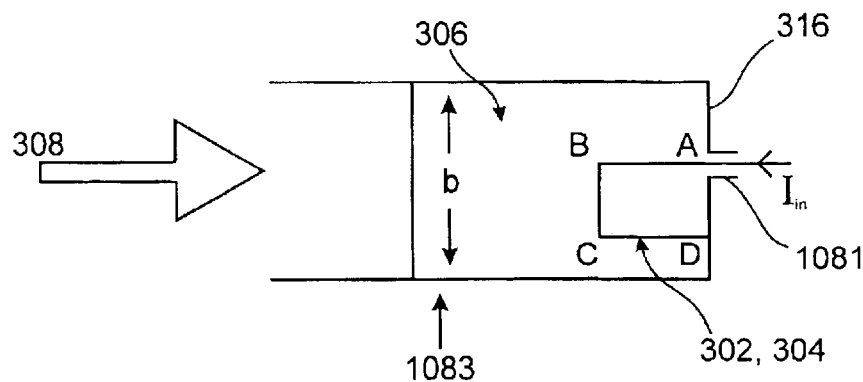
FIG. 8 is a diagram illustrating an equivalent unit cell for the antenna array shown in FIG. 7.
Figure 9:
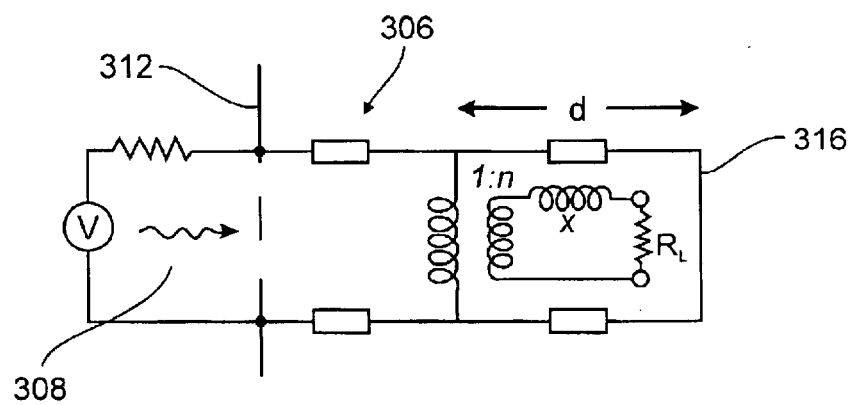
FIGS. 9 to 11 are diagrams illustrating equivalent circuits for the unit cell shown in FIG. 8.

Referring to FIG. 7, an embodiment 300 of a microwave near-field scanner according to the invention is shown. Here, an array similar to that shown in FIG. 6 is presented having a different output port dual-polarization array configuration with a plurality of antenna elements in the form of offset half-loops 302, 304 attached at one end 1071 to a solid backplane 316 and protruding through the backplane 316 through openings 1073 to a transmission line 1075 coupled with a signal analysis system. The receiver is shown with an absorber material 1077 disposed thereon. Optionally, other antenna elements are employed. The solid backplane 316 effectively reduces leakage of the waves to and from following sub-systems. A unit cell representation for the embodiment 300 is given in FIG. 8. Each half-loop of sides d between points ABCD acts as a transition of a wave in the unit cell to a current $I_{in}$ in the coaxial line 1081. This transition is modeled by a transformer of ratio 1:n and selfreactance j X, as shown in FIG. 9. An expression for the transformer ratio for the interaction of the portion BC of the loop with the unit cell dominant mode is given using Harrington's stationary formula as $n^2 = (1/I^2_{in}) \int \int J_s \cdot e_0 ds$, where $J_s$ is the surface current vector in length BC, $e_0$ is the unit cell dominant mode vector and S is the unit cell transverse plane including length BC. Since the half-loops are electrically very small, the current in them is considered to be constant for modeling thereof leading to an expression for the transformer ratio as n=d/b, where b is the dimension of the—square—unit cell cross-section. Because of the electrically small size of the half-loops and their relatively large distance from the unit cell walls, it is possible to approximate the reactance of the half-loop of periphery 3d by half of the reactance of an isolated circular loop of circumference 2πd and conductor radius r, i.e. $X \approx \mu d \{(\ln(8d/r)-2)\}/2$. Electric field pick-up is typically negligible for the small loops considered. If magnetic absorber material is employed, any significant losses in and magnetizing current for the loop magnetic "core" are included in the model using a shunt resistance and inductance—of high impedance— across the primary section of the transformer model.

In a similar fashion as described above, if the cell size is small compared to a wavelength of radiation to be detected and the loop is kept away from the cell walls the transformer ratio n and the loop reactance j X are substantially independent of the direction of travel of the wave. The criteria for loop size and spacing disclosed above also prevent edge effects.

The loaded loop in each cell causes a change in the shunt impedance across the cell and, therefore, the absorber is preferably "retuned" to maintain its match to the incoming wave.

Figure 10:
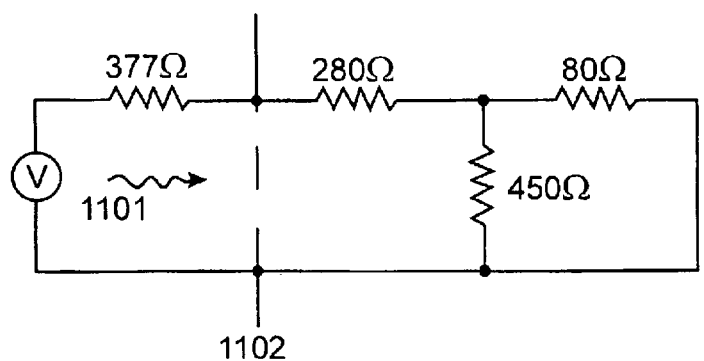

P-Spice simulations were carried out at 900 MHz for an array of half-loops at 3 mm spacing protruding 1 mm from the conducting backplane into a 4.5 mm thick ferrite tile. The front face of the ferrite tile is placed 1 cm from a 2 cm aperture radiating 100 mW into each polarization of a uniform hemispherical wave. For this very thin absorber, π-equivalent circuits for each absorber transmission line length are used, with parameters determined from the product of material RLGC parameters and the line lengths. Using given constitutive parameters of the ferrite, the series resistance modeling magnetic losses is shown to be by far the dominant component. Neglecting the loop reactance, the model for the EUT/Scanner system then takes—for the half-loop closest to the aperture—the simple form and parameter values shown in FIG. 10. The half-loop is terminated by the 50Ω input impedance of a signal processing sub-system transformed to the transmission line side of the transformer. In FIG. 10 a broadside wave 1101 is shown incident on an absorber interface 1102.

Figure 11:
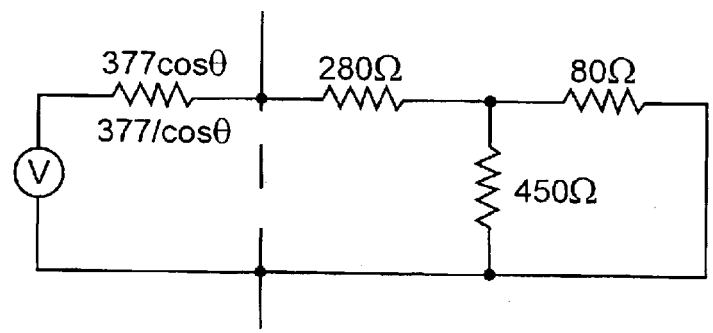

The output signal of the half-loop is evaluated at −14dBm for the half-loop closest to the aperture, in close agreement with P-Spice simulations. The equivalent circuit gives a reflectivity of −28dB at the front of the absorber, also in close agreement with simulations. For other half-loops with the EUT radiation incident at angles up to 80 deg, the model for the absorber transmission line lengths is normally dependent upon the angle of incidence. However, for the ferrite absorber of negligible dielectric losses considered here, an expression developed for the dominant R parameter of the absorber sections is approximately constant with angle. The model then takes the form shown in FIG. 11. At the periphery, the smallest signal collected is −54dBm compared to −51 dBm obtained from simulations. This equivalent circuit shown in FIG. 11 provides a worst-case reflectivity of −10dB, which is in fair agreement with −3dB from simulations. The above cited circuit simulations implement a general model for a single wave incident at any direction of propagation and for either polarization on the antenna elements.

Optionally, the absorber is of a multi-layer type–for example complex ferrites, Jauman etc.–using the specification of the constitutive parameters of each layer.

With a half-loop reactance of approximately 10Ω included in the model, a small decrease in output signal intensity results. Optionally, the input impedance of the signal processing sub-system includes a series capacitive component to series resonate the half-loop inductance and increase the maximum output signal intensity to approximately −14dBm.

Loading of the absorber/reflector by the half-loop array results in an improvement in the broadside reflectivity at 900 MHz from −23 dB to −26 dB.

Residual errors in the output results of the Scanner are caused by multiple reflections between the Scanner and the EUT, imperfect positioning of the half-loops, array edge effects, and errors in the local signal processing sub-system.

Figure 12:
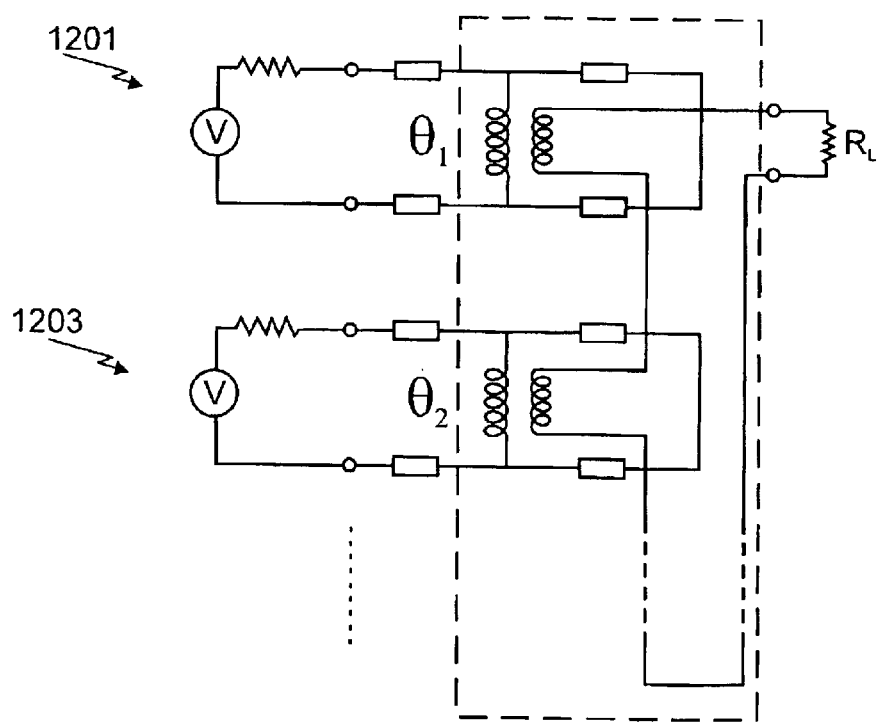
FIG. 12 is a diagram illustrating a circuit for combining equivalent circuits each for one PWS component to antenna element terminals.

From FIG. 12, it is evident that if the parameters of the absorber transmission line and current-measuring technology are known, the amplitude and phase of the plane wave incident on the front face of the absorber are determined from the amplitude and phase of the voltage across the half-loop load. The Absorber/Half-Loop Array is, therefore, optionally viewed as a lossy receive antenna "transforming" the PWS at each PWS component 1201, 1203 just outside the front surface of the absorber into the voltages measured at its multiple output ports. The voltage at each output port is a linear combination of the voltages of the plane waves in each direction. If the number of output ports equals the number of discrete wave directions for specifying the radiation, a set of simultaneous equations is solved for determining the PWS. The greater the number of measurement locations within the radiated beam, the more wave directions are specified, resulting in greater accuracy.

Figure 13:
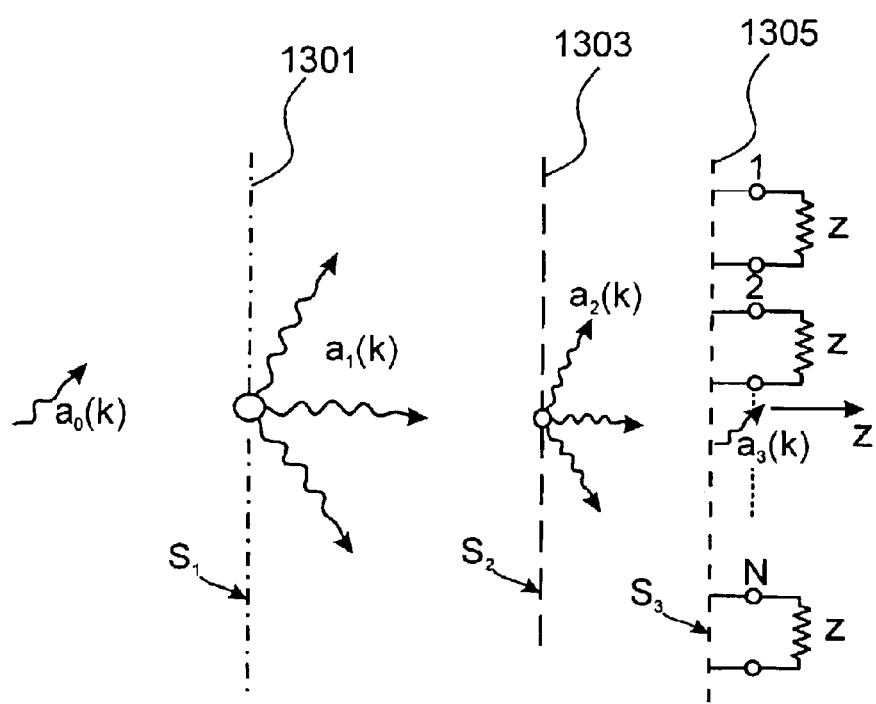
FIG. 13 is a diagram illustrating a forward scattering matrix model for the antenna shown in FIG. 7.

If total reflection at the air/absorber interface 1303 does not occur for all directions of propagation within the PWS and multiple reflections between the EUT and the Scanner are negligible, a forward scattering matrix representation of the Scanner is possible, as shown in FIG. 13. The absorber width is defined by outer and inner planar surfaces $S_1$ and $S_2$, with $S_2$ being coincident with the half-loop virtual plane $S_3$ 1305. The forward-direction PWS just outside and just inside $S_1$ are written as $a_0(k)$ and $b_1(k)$, respectively. The PWS at plane $S_2$ (also the absorber interface 1303) is written as $b_2(k)$, where k is the propagation constant vector describing the direction of propagation of each wave. The first two vector wave amplitudes are related by the forward scattering parameter $S_{01}(k)$ describing refraction at the front surface $S_1$ of the absorber. Thus, for each polarization $$b_1(k)=S_{01}(k)a_0(k).$$

Vectors $b_1(k)$ and $b_2(k)$ are related by the phase change and attenuation through the absorber bulk, thus $$b_2(k)=\exp(jk.r)b_1(k).$$

The wave amplitude $b_2(k)$ is then subject to the k-dependent response of the half-loop array. The output signal at an array port sums all contributions by the plane wave components received at the virtual measurement plane $S_3$ 1301, modified by the receive characteristics $s_{23}(k)$ of the loaded half-loops. Using standard scattering matrix representations, the output wave amplitudes $a_3(R)$ incident on the impedances Z are given by $$a_3(R)=\int\int a_0(k)s_{01}(k)S_{23}(k)\exp(jK.R)dk,$$

where K and R are the transverse to z portions of the propagation constant vector k and position vector r, respectively. Using the inverse Fourier transform $$a_0(k)s_{01}(k)s_{23}(k)=1/4\pi^2\int\int a_3(R)\exp(-jK.R)$$

is obtained, where $a_3$ (R) is readily determined from the vector voltage across Z, using standard s-parameter theory. The PWS of interest $a_0(k)$ is determined once $s_{01}(k)$ and $s_{23}(k)$, the resultant forward scattering parameters of the Absorber/Half-Loop array are known.

Figure 14:
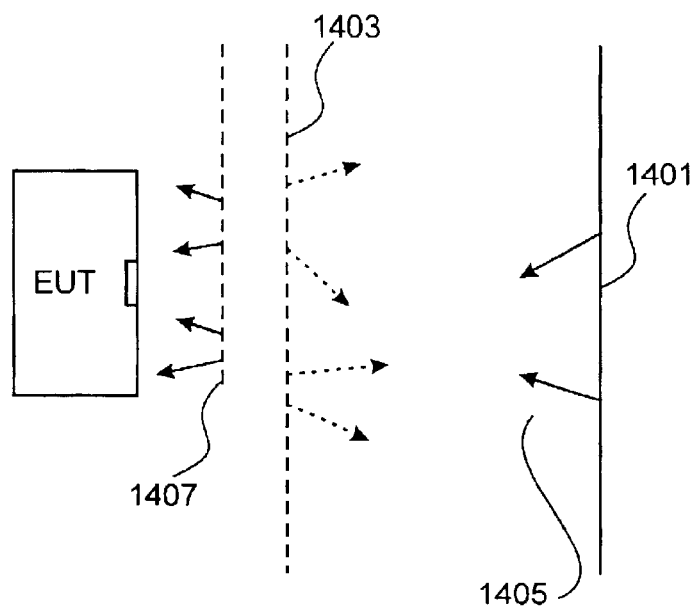
FIG. 14 is a diagram illustrating wave reflection between equipment under test and antenna array according to the invention.
Figure 15:
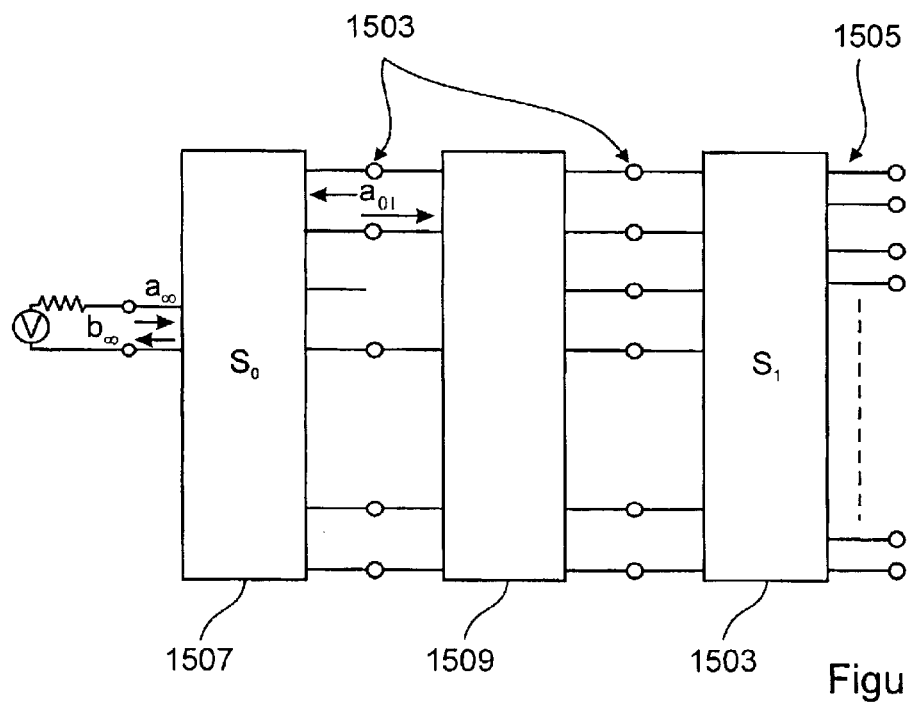
FIG. 15 is a diagram illustrating a scattering matrix representation of the reflection environment shown in FIG. 14.

Some specular reflection typically occurs at the absorber. Each reflected plane wave propagates back to the EUT plane, and upon scattering, produces a set of scattered plane waves 1403. Thus, the total scattered PWS is obtained as a superposition of the scattered plane waves from each of the component plane waves of the absorber 1401 reflected PWS 1405 which is incident on the EUT 1507, as shown in FIG. 14. A scattering matrix representation for the EUT/Scanner reflections, including multiple reflections, is illustrated in FIG. 15. If the reflection parameters of the EUT—submatrix of $S_0$—and the full parameter set of the scanner matrix $S_1$ are determined, the scanner output voltages provide the measured EUT radiation in any characterized environment including free-space. In FIG. 15 ports of PWS 1503 are shown between blocks.

Reflections from the periphery of the absorber to conducting objects beyond the measurement environment 1407 are avoided since reflections from these objects back to the Scanner cause errors. For example, the Scanner includes additional absorber material to close up this "free-space" 1509 boundary at the edges of the EUT 1507 and Scanner 1503. Scattering at the edge of the planar absorber is reduced by this additional material, and the Scanner 1503 is calibrated with its full complement of absorber.

Differences between the actual relative positions of the EUT 1507 and the Scanner 1503 and their reference positions used for computation result in some errors. These errors compound with the number of significant reflections between the EUT 1507 and the Scanner 1503.

Apart from determining electric, magnetic, and power distributions in the far-field, measurements with the Scanner are useful to estimate distributions on any plane on the aperture side of the Scanner, including the aperture itself. The large extent of the measurement plane relative to the distance from the aperture of the EUT gives the Scanner the potential for high horizontal and vertical resolution.

Figure 16:
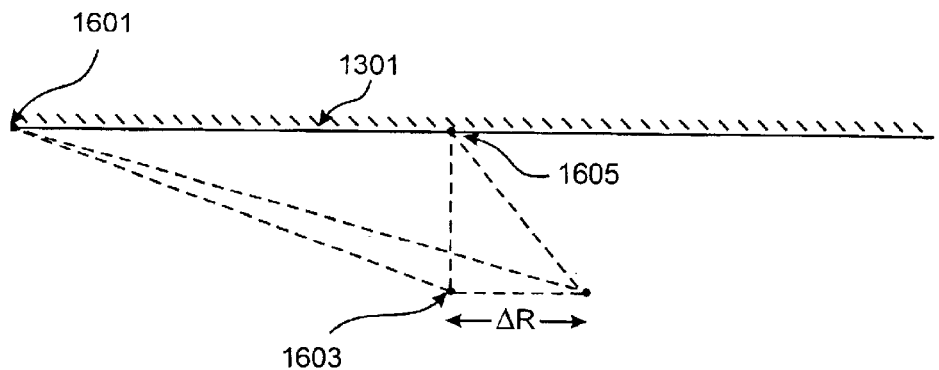
FIG. 16 is a diagram illustrating the geometry for determining the resolution of an antenna array.

An estimate of horizontal resolution of the Scanner is derived in the following. Referring to FIG. 16 a point radiator is centrally located in front of a 14×14 cm measurement plane 1301, at a distance of 1.4 cm. A horizontal movement of $\Delta R$ by the radiator 1603 results in amplitude and phase changes of the received signal at every measurement location. The criterion for resolution used here is that the movement $\Delta R$ is accurately described only if the amplitude and phase changes are each greater than the amplitude and phase-measurement accuracy of the Scanner for 50% or more of the measurement locations. The measurement accuracies in the present examples are of the order of 5% in amplitude and 30° in phase. Amplitude changes of 5% are detected at all locations for a point radiator 1603 movement of 3 mm. The greatest path length difference, approaching a value of $\Delta R$, occurs at the edge 1601 of the measurement plane 1301. Central elements about the centre location 1605 experience smaller phase shifts. The value of $\Delta R$ corresponding to a phase difference of 30° over 50% of the plane is approximately 3 mm. As mentioned above, a greater extent of the measurement plane 1301 with more locations detecting the phase difference results in higher resolution. Using the same criterion as for the horizontal resolution the vertical resolution is calculated at 3 mm.

The two-dimensional Nyquist sampling theorem states that for a wave-number-limited spectrum of waves, the electric—and magnetic—field is reconstructed for all points on a plane from a knowledge of its values at the lattice of sampling points separated by $$\Delta_x=\Delta_y=\pi/k_{xm}=\pi/k_{ym}$$

where $k_{xm}$ and $k_{ym}$ are the maximum transverse wave numbers encountered.

In general, the PWS of the electromagnetic field within the evanescent wave region of a radiator has no wave number—$k_x$ and $k_y$—limit, and the sampling interval is vanishingly small. However, by locating the sampling plane outside this region, the sampling interval is increased. A general expression exists for the minimum attenuation $\alpha_{min}$ of evanescent waves which are not recovered by sampling at the rate $\Delta s$ on a measurement plane located a distance $N\lambda$ from a radiator as $$\alpha_{min}\cong 54.6N[(\lambda/2\Delta s)^2-1]^{1/2} \text{ dB}$$

This minimum attenuation is usually chosen an order of magnitude greater than the dynamic range of the Scanner (28 dB). For a minimum attenuation of 280 dB on a measurement plane distanced 3 cm—0.1 $\lambda$ at 900 MHz—from the EUT, the necessary sampling distance is 3 mm. For a 1.4 cm distance of the measurement plane, the sampling interval reduces to 1.4 mm.

Far-field information computed from near-field scanning is commonly given for at least $10^4$ directions. This corresponds to 100 wave numbers and find measurement samples in each of the x- and y-directions. The sampling interval is then a linear function of the distance from the aperture of the EUT. For a 14×14 cm array at 1.4 cm from the EUT an interval of 1.4 mm is necessary. For a 30×30 cm Scanner at 3 cm distance from the EUT this interval increases to 3 mm.

The absorber preferably meets 3 requirements. First, its reflectivity is in general such that multiple reflections between the EUT and the Scanner do not affect measurement accuracy. Second, the attenuation of waves traveling through the absorber is small enough to yield adequate signal strength at the outputs of the measurement plane. Third, the absorber allows discrimination between the components of the PWS. That is, sufficient amplitude and phase information is retained at the measurement plane to uniquely identify any individual wave component of the PWS incident on the absorber.

The first requirement is met when reflected waves reaching any location on the half-loop array are either 20 dB below the directly received wave or produce a signal below a minimum detectable level. This criterion leads to a nominal absorber specification of −20 dB reflectivity at angles of incidence and frequencies determined by the class of EUT.

The PWS of a small planar aperture is expected to contain components with directions as much as 80° to broadside. Thus an absorber of wide angular bandwidth is employed for testing next-generation cellular phones. An 80° absorber is also useful for a general purpose Scanner. For cellular phones a separate Scanner is envisaged for each frequency band of operation, thus reducing the frequency bandwidth of each individual Scanner, but is not limited thereto.

Figure 17:
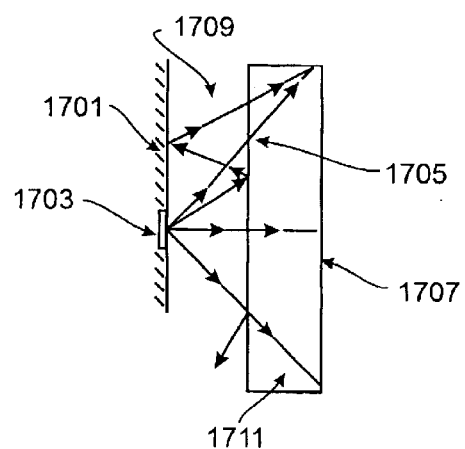
FIG. 17 is a diagram illustrating the geometry of a system of equipment under test and antenna array; and, FIG. 18 is a simplified diagram illustrating a signal processing network for processing signal provided by the antenna array.

For some EUTs, it is possible to use absorber material having an absorber reflectivity of less than −20 dB. Referring to the geometry shown in FIG. 17, an BUT having an EUT body 1701 and an aperture 1703 is shown. Errors in measured field quantities are caused by the reflection of waves by the absorber 1711 and then again by the EUT body 1701 or other objects close to the Scanner in the form of an array of loop receivers 1707. What is sought to be measured is the direct path of the waves as shown for example at 1705. If the EUT body 1701 and the nearby objects are not metallic, attenuation of the multiple reflected waves (shown at 1709) occurs. This attenuation is increased by using absorbing material covering the body of the EUT.

For measurement of near-hemispherical radiation using a planar antenna array, the measurement plane is placed at a maximum distance of 3 cm from the EUT. With a reactive zone extending from the EUT approximately 1 cm, the maximum absorber thickness is approximately 2 cm. Optionally, the absorber reaches into the reactive zone if this causes only a negligible effect on the EUT source oscillator, and evanescent waves are sufficiently attenuated before reaching the measurement plane.

Further optionally, a hemispherical Scanner is used allowing use of a thicker absorber layer and reducing the reflection of waves at the absorber by having a large portion of the front face of the surface approximately perpendicular to the radiation.

Figure 18:
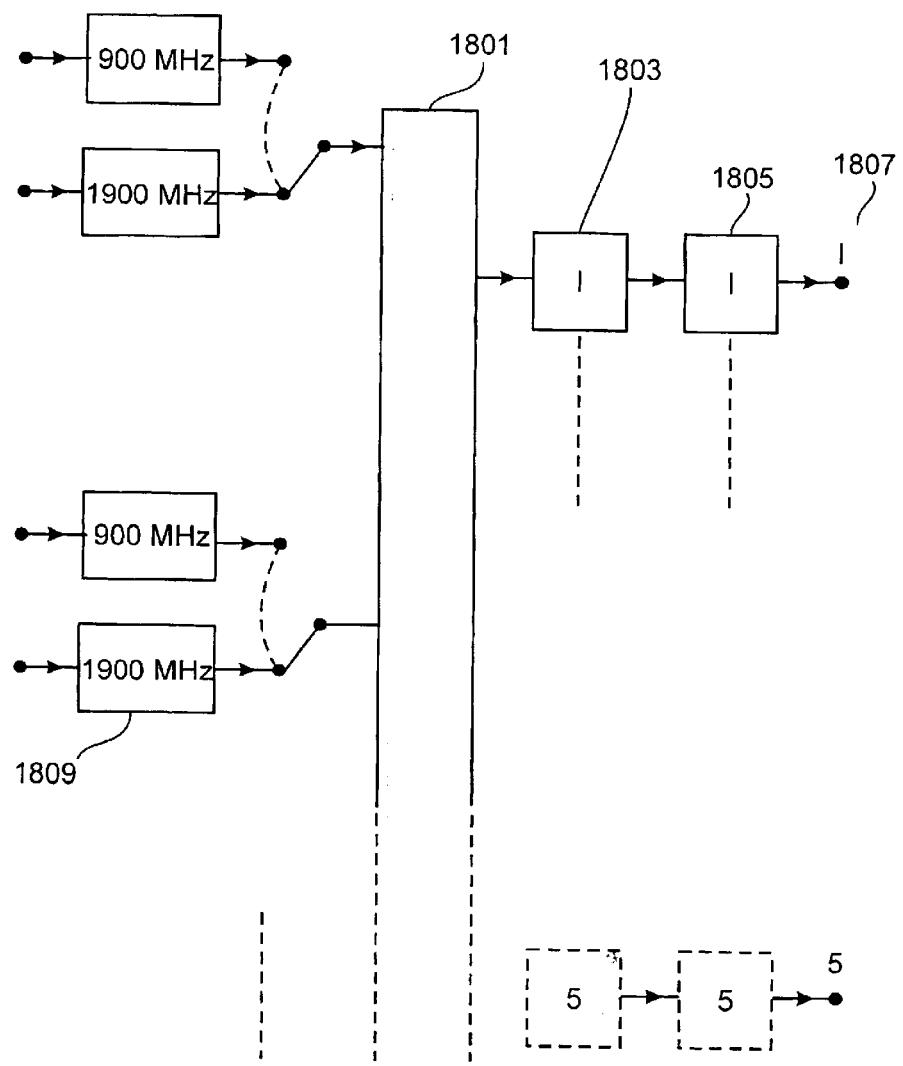

Referring to FIG. 18, for a solid single layer ferrite absorber having negligible variation of permittivity and permeability with frequency, transmission line theory shows that variations in frequency and direction of travel of the incident wave have an equivalent effect on reflectivity of the absorber. For example, a 10% change from the centre frequency of a design has the same effect on the reflectivity as a 10% change in the cosine of the angle between the normal to the antenna array and the direction of propagation of the wave. In the 900 MHz and 1.9 GHz bands the −20 dB reflectivity of ferrite absorber materials is at frequencies being approximately ±5 to 10% from the design center frequency. This corresponds, for a center angle of 40° at a single design frequency, to points of −20 dB reflectivity at angles of 32° and 47°. Optionally, the angular bandwidth of the absorber is increased using multi-layer structures such as layers of ferrite and dielectric or ferrite and Jauman absorber materials.

In a typical application, the Scanner comprises $2 \times 10^4$ antenna elements at 3 mm spacing on a 30cm ×30 cm planar measurement surface. Use of for example, 2500+312+39+5 single-pole/eight-throw (SP8T) absorptive switches reduces the number of output channels to 5. Each multiplexer channel—through 4 switches forming a multiplexer chain 1801— is characterized for attenuation and phase shift over the frequencies of interest. Insertion loss in each switch is typically 0.7 to 0.8 dB. Return losses of 10 dB or more at switch input port and output port and isolations of 30 dB are typical.

As shown above, a minimum output intensity of −52 dBm from each antenna array element was determined. Considering losses in the multiplexing circuit, a minimum signal of 55 dBm results. In order to obtain a recommended level for high-resolution A/D conversion of −31 dBm, an amplifier chain 1803 of 24 dB gain is employed. Minimum measurement signals of −55 dBm are well within the operating range of LNAs which are capable of processing signals to −75 dBm with gains of 13 to 17 dB.

When using a hemispherical antenna array it is possible to obtain a minimum signal output intensity that is large enough for high-resolution A/D conversion by an A/D converter 1805, obviating the amplifying step.

The output signal from each amplifier chain is then converted to a digital signal in an A/D converter 1805 and transmitted via output port 1807 to a processor for signal processing. Optionally the RF output signals are provided to a RF output port for analysis by spectrum analysis apparatus, etc.

The planar Scanner is calibrated by performing measurements at all array locations using a plane wave of minimal and known deviations of wave front amplitude and phase from an ideal wave front. For example, such a reference wave front is generated in the far-field of a standard antenna and measured using an Absorber/Half-Loop array with only one half-loop present and moved through all locations of the array elements. The Scanner calibration is performed for different angles of incidence of the incoming waves within an anticipated range of the PWS at frequencies of interest. Alternatively, the wave front is measured using the modulated scatterer technique.

A hemispherical or a cylindrical Scanner is calibrated by performing measurements at all array positions in a dominant hemispherical or cylindrical wave of known wave front amplitude and phase. For example, such a reference field is generated using a small waveguide-fed slot in a large ground plane and measured using a single half-loop or alternatively, the modulated scatterer technique.

In calibrations with multiple reflections the reflection parameters of the Scanner and the EUT are obtained for all incident wave angles of interest by subtracting the known incident wave from the measured total PWS of this wave.

Numerous other embodiments of the invention will be apparent to persons skilled in the art without departing from the spirit and scope of the invention as defined in the appended

What is claimed is:

1. An antenna array for measuring an electromagnetic field comprising:
    a plurality of substantially identical antenna elements having a substantially shorter length than a wavelength of the electromagnetic field and being placed at a substantially same spacing between consecutive antenna elements, the spacing being larger than approximately three times the length of the antenna elements, each antenna element for sensing the electromagnetic field at a predetermined location and for providing a signal in dependence thereupon, the signal being indicative of an approximately accurate electromagnetic field strength substantially absent mutual coupling effects between the antenna elements.

2. An antenna array for measuring an electromagnetic field as defined in claim 1 wherein each antenna element has an impedance large enough to substantially reduce scattering effects by limiting flow of current in said each antenna element.

3. An antenna array for measuring an electromagnetic field as defined in claim 2 wherein the reactance of each of the antenna elements is approximately independent of a direction of propagation of a plane wave incident thereupon.

4. An antenna array for measuring an electromagnetic field as defined in claim 3 wherein a transformer ratio of each of the antenna elements is approximately independent of a direction of propagation of a plane wave incident thereupon.

5. An antenna array for measuring an electromagnetic field as defined in claim 4 wherein the antenna elements for receiving electromagnetic radiation of a same polarization are disposed such that the antenna elements have an approximately same orientation.

6. An antenna array for measuring an electromagnetic field as defined in claim 5 wherein the antenna elements are dipoles.

7. An antenna array for measuring an electromagnetic field as defined in claim 5 wherein the antenna elements are loops.

8. An antenna array for measuring an electromagnetic field as defined in claim 5 wherein the antenna elements are half loops.

9. An antenna array for measuring an electromagnetic field as defined in claim 1 comprising a ground plane disposed behind the antenna elements.

10. An antenna array for measuring an electromagnetic field as defined in claim 9 comprising an absorber disposed between the ground plane and a source of the electromagnetic field.

11. An antenna array for measuring an electromagnetic field as defined in claim 10 wherein the absorber is at least partially disposed between the antenna elements and a source of the electromagnetic field.

12. An antenna array for measuring an electromagnetic field comprising:
a plurality of substantially identical antenna elements having a substantially shorter length than a wavelength of the electromagnetic field and being placed at a substantially same spacing between consecutive antenna elements, the spacing being larger than approximately three times the length of the antenna elements, each antenna element for sensing the electromagnetic field at a predetermined location and for providing a signal in dependence thereupon, the signal being indicative of an approximately accurate electromagnetic field strength substantially absent scattering effects between the antenna elements.

13. An antenna for measuring an electromagnetic field comprising:
an array of antenna elements for sensing the electromagnetic field at a predetermined location and for providing a signs in dependence thereupon;
an electromagnetically separating layer for substantially shielding the electromagnetic field sensed by the array of antenna elements from electromagnetic radiation emitted from circuitry transmitting the signal; and,
an absorber disposed between the electromagnetically separating layer and a source of the electromagnetic field for limiting reflections of the electromagnetic radiation.

14. An antenna for measuring an electromagnetic field as defined in claim 13 wherein the array comprises at least one planar array and wherein the electromagnetically separating layer comprises at least one planar layer oriented parallel to the at least one planar array.

15. An antenna for measuring an electromagnetic field as defined in claim 13 wherein the array comprises a hemispherical array and wherein the electromagnetically separating layer comprises a hemispherical layer oriented parallel adjacent the hemispherical array.

16. An antenna for measuring an electromagnetic field as defined in claim 13 wherein the electromagnetically separating layer comprises a ground plane.

17. An antenna for measuring an electromagnetic field as defined in claim 13 wherein the ground plane comprises at least one opening for transmitting the signal provided by the array therethrough.

18. An antenna for measuring an electromagnetic field as defined in claim 17 wherein the at least one antenna element of the array of antenna elements comprises a half loop.

19. An antenna for measuring an electromagnetic field as defined in claim 18 wherein a first end of the at least one antenna element of the array of antenna elements is connected to the ground plane.

20. An antenna for measuring an electromagnetic field as defined in claim 13 wherein the electromagnetically separating layer is adjacent the absorber.

21. An antenna for measuring an electromagnetic field as defined in claim 20 wherein the at least one antenna element of the array of antenna elements is disposed within the absorber.

22. An antenna for measuring an electromagnetic field as defined in claim 13 wherein the absorber comprises a dielectric absorber.

23. An antenna for measuring an electromagnetic field as defined in claim 13 wherein the absorber comprises magnetic absorbing material.

24. A method for measuring strength of an electromagnetic field emitted from a source comprising the steps of:
disposing at a predetermined location a plurality of substantially identical antenna elements having a length being substantially shorter than a wavelength of the electromagnetic field and having a substantially same spacing between consecutive antenna elements, the spacing being larger than approximately three times the length of the antenna elements;
measuring a field strength of the electromagnetic field at each antenna element and providing a signal in dependence thereupon, the signal being indicative of an approximately accurate electromagnetic field strength substantially absent mutual coupling effects between the antenna elements; and,
determining the approximately accurate electromagnetic field strength at each predetermined location absent a step of signal post processing for correcting the mutual coupling effects between the antenna elements.

25. A method for measuring strength of an electromagnetic field emitted from a source as defined in claim 24 further comprising a step of determining a plane wave spectrum from the signals.

26. A method for measuring strength of an electromagnetic field emitted from a source as defined in claim 25 wherein the number of signals is approximately equal a number of discrete wave directions for approximately specifying the electromagnetic field.

27. A method for measuring strength of an electromagnetic field emitted from a source as defined in claim 26 wherein the plane wave spectrum is determined by solving a set of simultaneous equations.

28. A method for measuring strength of an electromagnetic field emitted from a source as defined in claim 27 wherein the plane wave spectrum is determined using a forward scattering method.

29. A method for measuring strength of an electromagnetic field emitted from a source comprising the steps of:

disposing at a predetermined location at least an array of antenna elements for sensing the strength of the electromagnetic field and for providing a signal in dependence thereupon;

disposing an electromagnetically separating layer for substantially shielding the electromagnetic field sensed by the at least one antenna element from electromagnetic radiation emitted from circuitry transmitting the signal;

disposing an absorber between the electromagnetically separating layer and a source of the electromagnetic field; and, measuring the strength of the electromagnetic field at the at least one antenna element and providing a signal in dependence thereupon, the signal being indicative of an approximately accurate electromagnetic field strength absent a step of signal post processing for correcting distortions of the measured field strength due to electromagnetic radiation emitted from the circuitry transmitting the signal.

30. A method for measuring strength of an electromagnetic field emitted from a source as defined in claim 29 further comprising a step of calibration by measuring a plane wave of minimal and predetermined deviations of wave front amplitude and phase from an ideal wave front.

31. A method for measuring strength of an electromagnetic field emitted from a source as defined in claim 30 wherein the calibration is performed for different angles of incidence of incoming waves within an anticipated range of a plane wave spectrum at frequencies of interest of the electromagnetic field.

32. A method for measuring strength of an electromagnetic field emitted from a source as defined in claim 31 wherein the predetermined location is at a distance substantially smaller than a wavelength of the electromagnetic field from the source.

33. A method for measuring strength of an electromagnetic field emitted from a source as defined in claim 32 further comprising a step of determining electric, magnetic, and power distributions in a far-field from the source.

34. A method for measuring strength of an electromagnetic field emitted from a source as defined in claim 32 further comprising a step of determining electric, magnetic, and power distributions in a near-field between the source and the predetermined location.

35. A method for measuring strength of an electromagnetic field emitted from a source as defined in claim 34 further comprising a step of determining electric, magnetic, and power distributions in aperture of the source.

* * * * *